(12) United States Patent
Chen et al.

(10) Patent No.: US 7,163,885 B2
(45) Date of Patent: Jan. 16, 2007

(54) METHOD OF MIGRATING AND FIXING PARTICLES IN A SOLUTION TO BUMPS ON A CHIP

(75) Inventors: Yu-Chih Chen, Yilan Hsien (TW); Ruoh-Huey Uang, Taoyuan Hsien (TW); Yu-Hua Chen, Nantou Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 265 days.

(21) Appl. No.: 10/862,515

(22) Filed: Jun. 5, 2004

(65) Prior Publication Data

US 2005/0227475 A1   Oct. 13, 2005

(30) Foreign Application Priority Data

Mar. 18, 2004   (TW)   ............................... 93107259 A (51) Int. Cl.
*H01L 21/00*   (2006.01)
(52) U.S. Cl. ....................................................... 438/613
(58) Field of Classification Search ................. 438/613
See application file for complete search history.

(56) References Cited

U.S. PATENT DOCUMENTS

| | | | |
|---|---|---|---|
| 5,221,417 A | | 6/1993 | Basavanhally .............. 156/629 |
| 5,336,547 A | * | 8/1994 | Kawakita et al. ........... 428/209 |
| 5,352,318 A | * | 10/1994 | Takabayashi et al. .... 156/272.6 |
| 5,616,206 A | * | 4/1997 | Sakatsu et al. ............. 156/230 |
| 5,965,197 A | * | 10/1999 | Jin et al. ..................... 427/180 |
| 5,980,636 A | * | 11/1999 | Okumura .................... 118/308 |
| 6,042,894 A | | 3/2000 | Goto et al. ................. 427/504 |
| 6,331,681 B1 | * | 12/2001 | Okumura .................... 174/267 |
| 6,844,048 B1 | * | 1/2005 | Murari et al. ............... 428/143 |
| 2005/0048697 A1 | * | 3/2005 | Uang et al. ................. 438/108 |

FOREIGN PATENT DOCUMENTS

EP   0691660   10/1996

* cited by examiner

*Primary Examiner*—Evan Pert (57) ABSTRACT

A method for dispersing and fixing particles on the bumps of a chip using an electrophoresis technology is provided. The particles and chip bumps are processed to carry charges by applying chemical bonding between metal and thiol with electric charges. The chip is placed in a reactor with a solution along with the conductive particles. The conductive particles are then migrated and fixed to the bonding locations on the bumps of a chip through an electrophoresis procedure. For conductive particles not carrying charges, they can sink naturally to the surface of chip bumps due to their higher density than water in the solution. An electroplating procedure is then applied to fix the conductive particles onto the bump.

26 Claims, 10 Drawing Sheets

|  | bonding method using conventional anisotropic conductive film | bonding method using conductive particle dispersion according to the present invention |
|---|---|---|
| Applicable bump distance ($\mu m$) | > 50 $\mu m$ | < 20 $\mu m$ |
| Conductive particle density (# of conductive particles per bump) | ~15 conductive particles per bump | >> 15 conductive particles per bump |

METHOD OF MIGRATING AND FIXING PARTICLES IN A SOLUTION TO BUMPS ON A CHIP

FIELD OF THE INVENTION

The present invention generally relates to a method for dispersing conductive particles, and more specifically to an electrochemical method that allows conductive particles to be self-positioned and selectively dispersed on the electrodes of a chip or substrate. It is applicable to flip-chip packaging technologies.

BACKGROUND OF THE INVENTION

In semiconductor packaging technologies, flip-chip is the most promising type of packaging method. Related arts and patents have been constantly brought up to propose various improved methods. Among these flip-chip packaging methods, the methods using printing and metal jetting bumping process are the most competitive ones due to their lower costs. However, when these methods are applied to the fine pitch bumping process, short circuit or high junction resistance due to solder joint bridging or missing phenomenon frequently happens. It causes the reliability issues of the packaged IC devices, and reduces the yield of the packaging process.

Anisotropic conductive film (ACF) is composed of conductive particles and polymer resin. It provides both electrical and mechanical interconnections between a chip and a substrate, and offers numerous advantages over traditional solders, including flexible and simple process at low temperature, fluxless formulations and friendliness to environment (lead free process). But due to the size limitation of the conductive particles, when the distances between the bumps on the chip or substrate are too small, the anisotropic conductive property no longer exists due to the conduction along the X-Y direction and all of the signals within the IC device are bridged. For the fine pitch interconnection with electrically conductive adhesive, arranging the conductive particles regularly within the polymer matrix is one of the methods to solving the problem which is mentioned above. The regular arrangement of the conductive particles is achieved mostly by using masks to uniformly distribute the conductive particles or disperse the conductive particles only on certain areas of the chip or substrate. An adhesive insulation layer is then coated to fix the conductive particles.

U.S. Pat. No. 5,221,417 teaches a method using external magnetic field to selectively disperse conductive particles to form an anisotropic conductive film. In this method, a layer of ferromagnetic film is first coated on a temporary substrate. The ferromagnetic film is then patterned using a photo-lithographic etching process. An external magnetic field is then applied so that the ferromagnetic film is magnetized with a polarity. Subsequently, conductive particles are dispersed on the ferromagnetic film. As the ferromagnetic film is magnetized, the conductive particles are only collected on the pattern of the ferromagnetic film. The conductive particles are then brought into contact with and thereby adhered to an adhesive layer on a substrate. An anisotropic conductive film with uniformly distributed conductive particles is obtained subsequently after removing the temporary substrate and ferromagnetic film. The foregoing method taught by the U.S. Pat. No. 5,221,417 is more costly as additional ferromagnetic film and photo-lithographic etching process are required. In addition, conductive particles would be stacked along the Z direction.

U.S. Pat. No. 6,042,894 teaches a method using a screen with pores to uniformly disperse conductive particles. In this method, conductive particles are given charges induced either by a strong electric field within a dry environment or by contacting with a roller or brash having a strong electric field. The screen is then applied with an opposite electric field to attract the conductive particles with charges to pass through the pores and fall on a sticking layer of a substrate. An anisotropic conductive film with uniformly distributed conductive particles is thereby obtained. As conductive particles are with charges of same electricity, a stacking of conductive particles along the Z direction is thereby avoided. However, the foregoing method is complicated, difficult to operate, and costly. Moreover, as the diameter of the conductive particles is reduced, the pores of the screen have to be shrunk and the cost for producing the screen is increased as well.

The two aforementioned methods for uniformly arranging conductive particles both first fix the conductive particles in a bonding film, then bond another chip to establish electrical connections. The present invention provides a method to uniformly and regularly fix the conductive particles on the bumps of a chip. Then a non-conductive bonding film is used to join the chip with another chip. The method provided by the present invention can not only reduce the production cost significantly, but also greatly increase the yield of bonding chips.

SUMMARY OF THE INVENTION

The present invention provides a method for dispersing conductive particles, which includes the following steps: preparing a chip having at least a bump conducting a pre-processing procedure, placing the chip in a reactor with a solution inside, conducting a surface processing procedure for a plurality of conductive particles, placing the conductive particles in the reactor, migrating the conductive particles to the bump of the chip and fixing the conductive particles thereto, and bonding to a substrate with nonconductive adhesive.

The present invention mainly relies on an electrophoresis technology. With an electrophoretic process, the conductive particles are migrated and self-positioned to their targeted positions on a chip. A major criterion for the application of electrophoresis is that the migrated particles or objects must be charged with charges. To achieve this criterion, the present invention utilizes a thiol compound to conduct a surface processing procedure on the conductive particles so that they are charged with charges. The conductive particles themselves are core-shell construction with polymer resin as core, then coated with metal at its surface. The metal layer is usually made by electroless Ni/Au process. The thiol compounds used here are amphiphile molecular, having a thiol functional group (—HS) at one end and a hydrophilic functional group on the other end of its molecular structure. The thiol group may form complex bonding with the metal Gold. These thiol compounds may carry different charges by adopting different hydrophilic functional group. The conductive particles bonded with the thiol compound are therefore induced with either a positive or negative charge.

The electrophoretic process of the present invention migrates the conductive particles having charges to the bumps of a chip in an alkaline, acid, or neutral aqueous solution by an externally applied electric field. The conductive particles are then fixed to the bumps by a proper fixing procedure so that the conductive particles will not drift away after removing the electric field. There are two ways to fix the conductive particles. One is to use an electrostatic force to fix the conductive particles onto the gold bumps or the chip. With different thiol compounds treatment, the conductive particles and gold bumps will charge with opposite charges. When the conductive particles approach the gold bump, they will be fixed by the electrostatic force. The other one is to add an electroplating solution with metallic ions into the reactor and electroplate a metal thin film with a pulse or direct DC current. The conductive particles are thereby fixed to their positions with the electroplated metal thin film.

The present invention is also applicable to conductive particles not carrying any charge. When these conductive particles are added into the solution in the reactor, because their density is larger than that of the water, these conductive particles would sink naturally onto a chip by gravity. An electroplating procedure is then applied to fix the conductive particles onto the bumps.

According to the present invention, the bumps on a chip can be either a metallic bump or a compliant bump made of a macromolecular polymer wrapped within a metallic layer. In addition, the metallic ions added into the electroplating solution might include Au-ions, Cu-ions, or Ni-ions.

With the method for fixing the conductive particles according to the present invention, the conductive particles are positioned and fixed to the bumps of a chip precisely. The chip then can be bonded with a substrate using a non-conductive adhesive. The method according to the present invention is not only used in fine-pitch applications but also has advantages such as simplified processes and low costs. The conductive particles fixed by the present invention will not come off during subsequent processing. The present invention is therefore also applicable to the flip-chip packaging.

The embodiments of the present invention can be classified into the dispersion and chip bonding of negative, positive, or neutral conductive particles. The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 1 is a flowchart showing the steps of a method for dispersing conductive particles according to the present invention.

DETAILED DESCRIPTION OF THE PREFERRED EMBODIMENTS

FIG. 1 is a flowchart showing the steps of the method for dispersing conductive particles according to the present invention. At the first step 101, a chip having at least a pad is placed in a reactor with a solution inside after the chip undergoes a pre-processing procedure. At the second step 103, a plurality of conductive particles are then placed in the reactor after the conductive particles undergo a surface processing procedure. The steps 101 and 103 can also be conducted in a reverse order. At the third step 105, the conductive particles undergo a fixing procedure. At last within the fourth step 107, the chip is bonded with a substrate. According to the present invention, within the preprocessing procedure of the first step 101, the chip is coated with a metallic layer and then an insulation layer, and the insulation layer on the bump is removed by etching. The surface processing procedure of the second step 103 causes the conductive particles to carry charges or carry no charge. Further details will be given later, using a thiol compound as an example depicted in FIG. 2, to describe how conductive particles carrying positive or negative charges are formed respectively. Nevertheless, the fixing procedure of the third step 105 would vary depending on whether the conductive particles carry charges and the polarity of the charges. In the following, the dispersion procedures for conductive particles carrying negative, positive, or no charges will be described in detail respectively.

Figure 2:
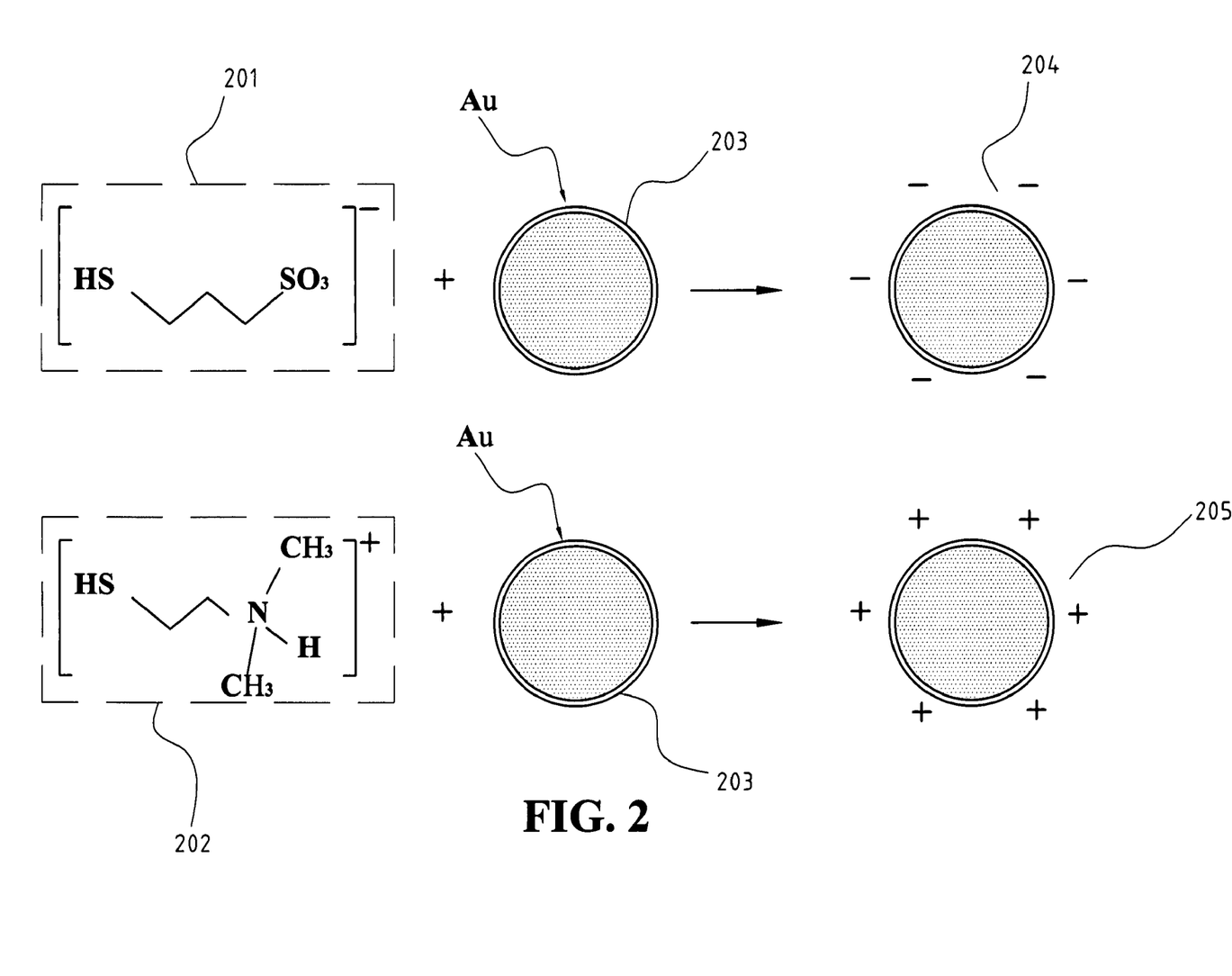
FIG. 2 is a schematic diagram showing the chemical bonding reactions between conductive particles and thiol compounds.

FIG. 2 is a schematic diagram showing the chemical bonding reactions between conductive particles and thiol compounds. As shown in FIG. 2, the thiol compound 201 carries a negative charge with sulfite ($—SO_3$) functional group. On the other hand, the thiol compound 202 carries a positive charge with dimethylamino ($-(CH_3)_2NH$) functional group. The conductive particle 203 is made of a macromolecular polymer wrapped within an outer Nickel/Gold film. After the negative charged thiol compound 201 is bonded with the Gold film of the conductive particle 203, a conductive particle 204 carrying a negative charge is formed. Similarly, after the positive charged thiol compound 202 is bonded with the Gold film of the conductive particle 203, a conductive particle 205 carrying a positive charge is formed.

Figures 3A, 3B:
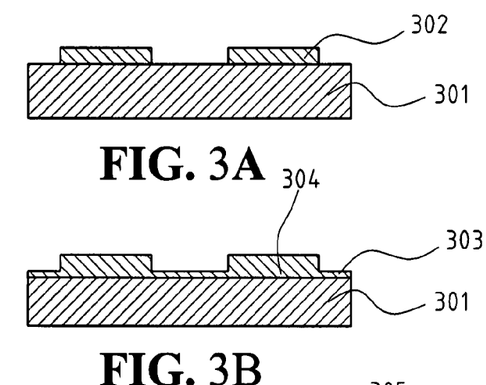
FIGS. 3a to 3i are schematic diagrams showing the steps of dispersing negative charged conductive particles respectively.
Figure 3C:
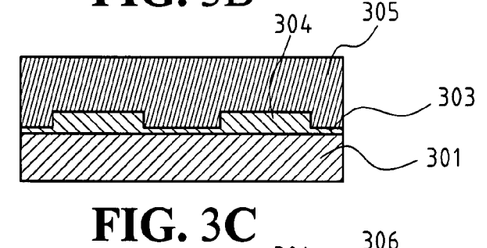
Figure 3D:
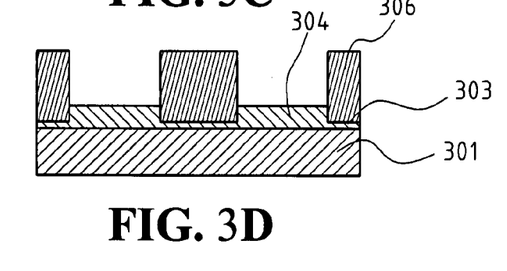
Figure 3E:
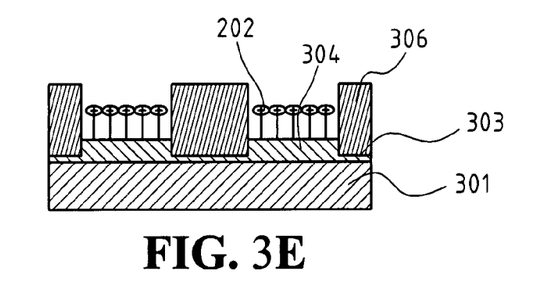
Figure 3F:
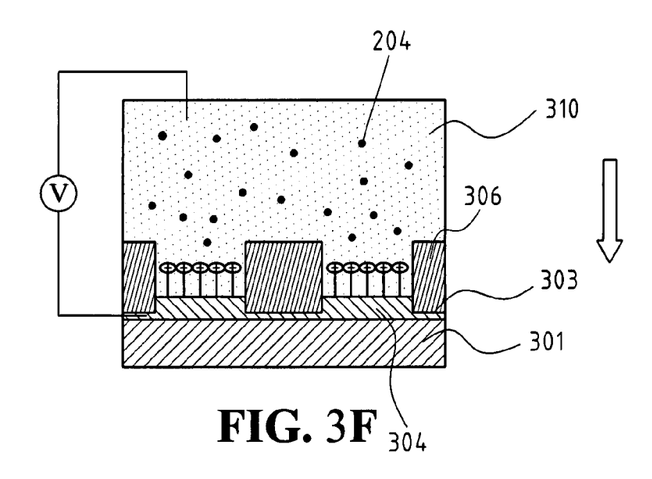
Figure 3G:
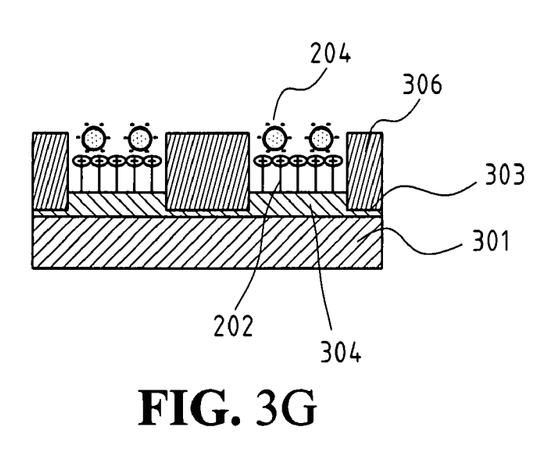
Figure 3H:
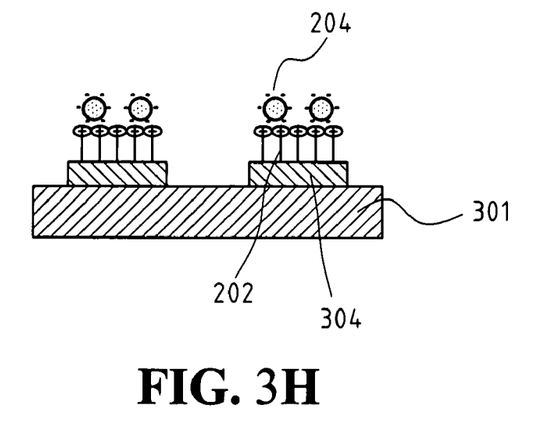
Figure 3I:
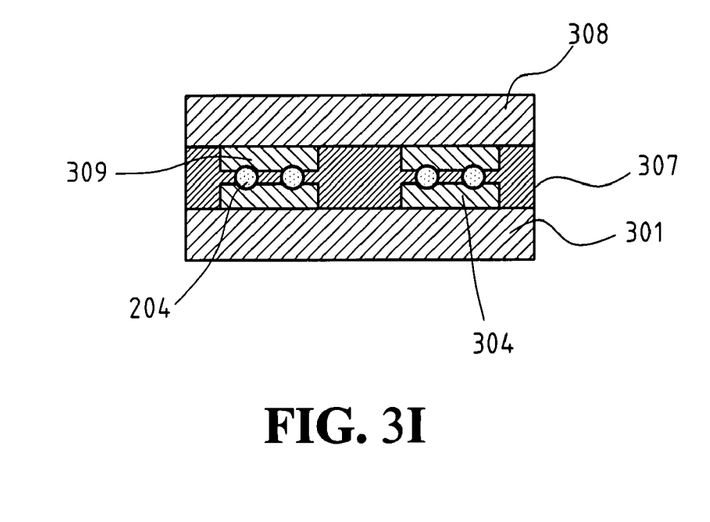

FIGS. 3a to 3i are schematic diagrams showing the steps of dispersing negative charged conductive particles respectively. As shown in FIG. 3a, a chip 301 has a plurality of bumps 302 on a surface of the chip 301 for bonding with a substrate (not shown in FIG. 3a). The chip 301 is then sputtered with a layer of Gold electrode 303. The Gold electrode 303 and the bumps 302 jointly form the Gold electrode bumps 304, as shown in FIG. 3b. A layer of photoresist 305 is coated on top of the Gold electrode 303 and the Gold electrode bumps 304, as shown in FIG. 3c. A lithography process is then conducted to remove the photoresist 305 on top of the Gold electrode bumps 304, and residual photoresist 306 is left on the Gold electrode 303, as shown in FIG. 3d. The etched chip 301 is then immersed in an aqueous solution with a thiol compound 202 carrying a positive charge. Through the reaction as depicted in FIG. 2, the surfaces of the Gold electrode bumps 304 therefore carry positive charges, as shown in FIG. 3c. The chip 301 is then placed in a reactor (not shown) with an electrophoretic solution 310, along with conductive particles 204 carrying negative charges. As shown in FIG. 3f, a positive electric field is applied on the Gold electrode 303 and the Gold electrode bumps 304. Due to the attraction between the positive and negative charges, the conductive particles 204 carrying negative charges migrate to the surface of the Gold electrode bumps 304 under the electric field. The conductive particles 204 carrying negative charges are therefore tightly coupled with the Gold electrode bumps 304 whose surfaces carry positive charges, and the conductive particles 204 will not drift away even after the electric field is removed, as shown in FIG. 3g. After the foregoing electrophoretic positioning and fixing procedure, the electric field is removed and the chip 301 is taken out of the reactor. The residual photoresist 306 and the Gold electrode 303 besides those on the Gold electrode bumps 304 are removed, as shown in FIG. 3h. In the last step, a non-conductive adhesive 307 is used to join the chip 301 and the substrate 308 together, as shown in FIG. 3i. The bumps 309 on the substrate 308, conductive particles 204 carrying negative charges, and Gold electrode bumps 304 jointly form the electric connection between the chip 301 and the substrate 308.

The positioning and fixing procedure as illustrated in FIGS. 3e to 3i is not applicable to conductive particles carrying positive charges because the bonding between Gold and the thiol compound 201 carrying a negative charge would be de-bonded under a negative electric field, causing the thiol compound 201 carrying a negative charge to be detached from the surface of the Gold electrode bumps. Another procedure using electroplating to fix the conductive particles has to be employed.

Figure 4A:
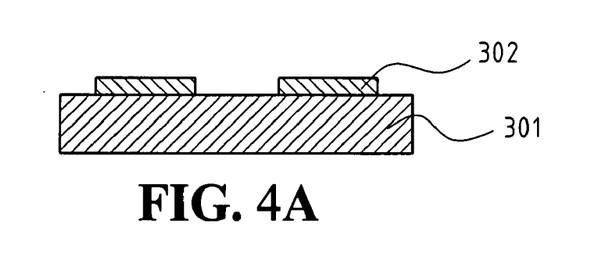
FIGS. 4a to 4i are schematic diagrams showing the steps of dispersing positive charged conductive particles respectively.
Figure 4B:
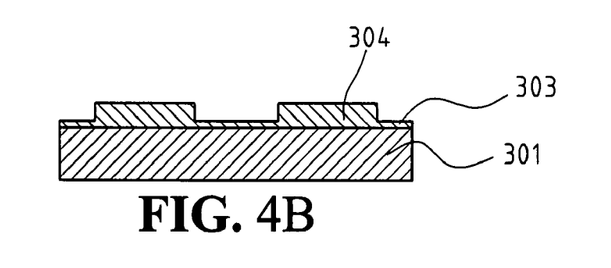
Figure 4C:
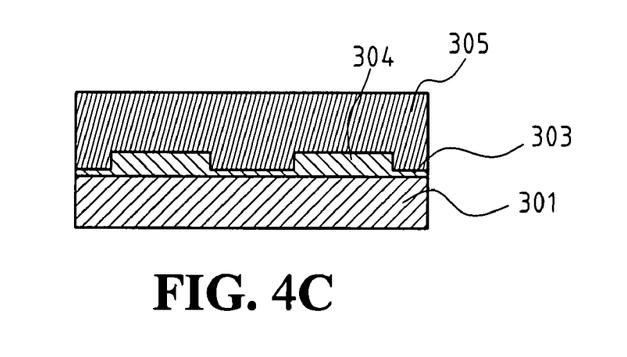
Figure 4D:
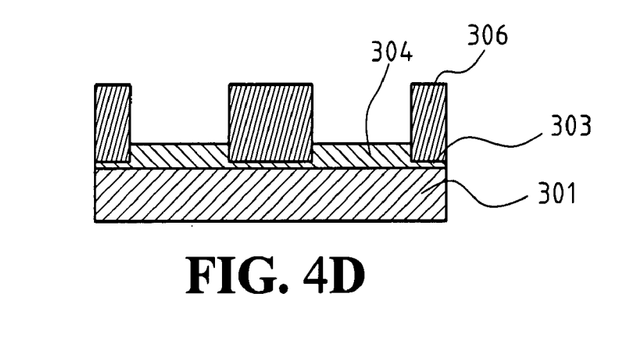
Figure 4E:
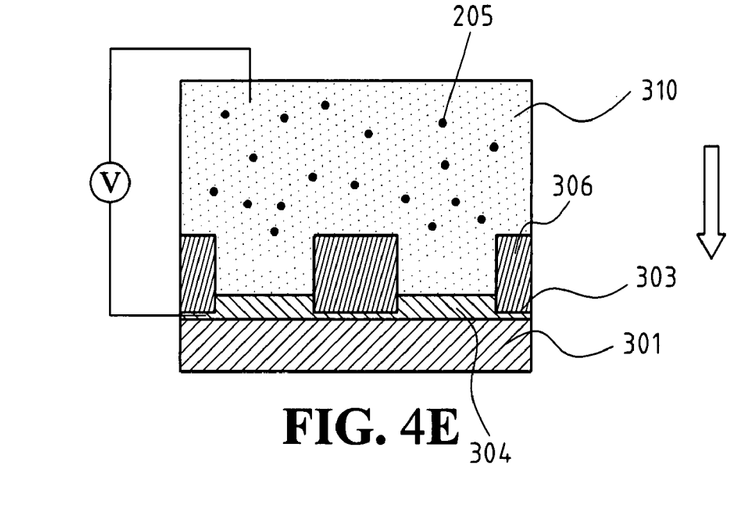
Figure 4F:
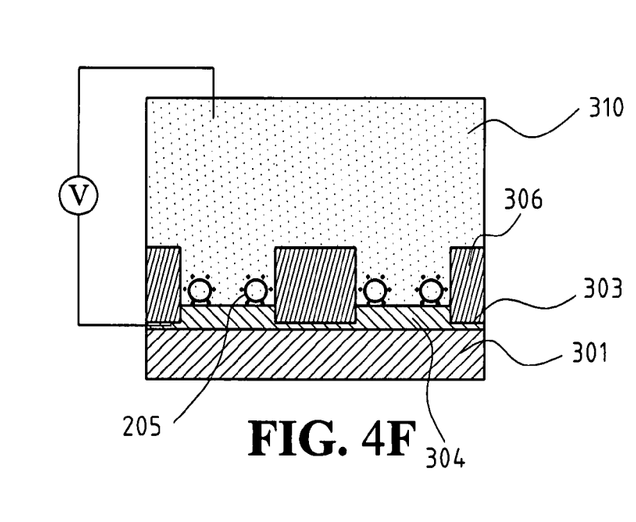
Figure 4G:
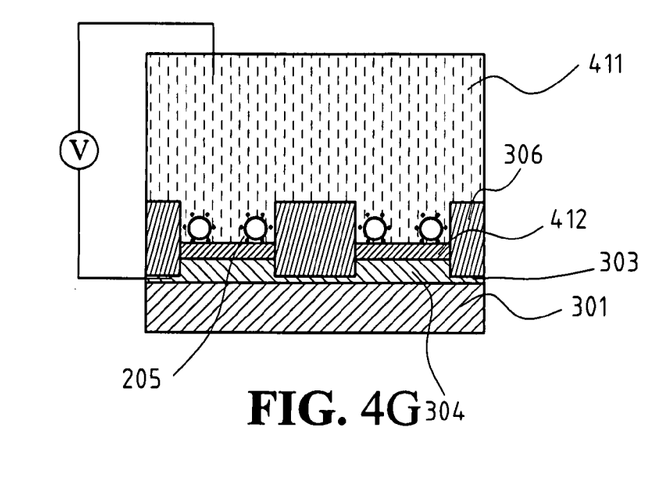
Figure 4H:
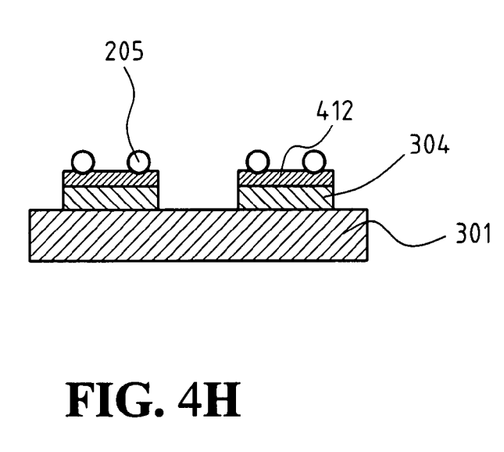
Figure 4I:
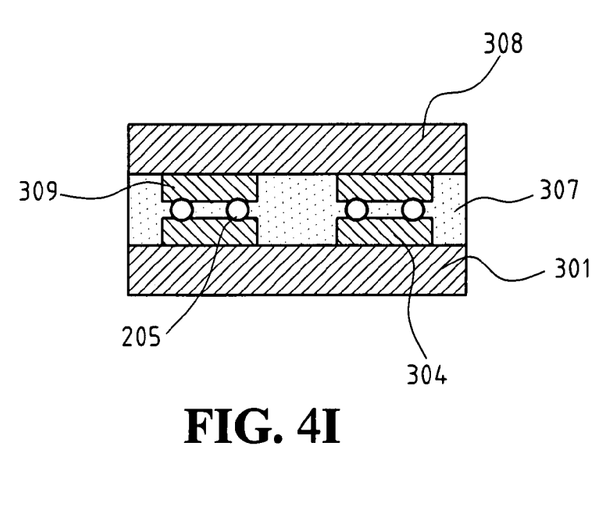

FIGS. 4a to 4i are schematic diagrams showing the steps of dispersing positive charged conductive particles respectively. As shown in FIG. 4a, the chip 301 has a plurality of bumps 302 on a surface of the chip 301 for bonding with substrate (not shown in FIG. 4a). The chip 301 is then sputtered with a layer of Gold electrode 303. The Gold electrode 303 and the bumps 302 jointly form the Gold electrode bumps 304, as shown in FIG. 4b. A layer of photoresist 305 is coated on top of the Gold electrode 303 and the Gold electrode bumps 304, as shown in FIG. 4c. A lithography process is then conducted to remove the photoresist 305 on top of the Gold electrode bumps 304, and residual photoresist 306 is left on the Gold electrode 303, as shown in FIG. 4d. The etched chip 301 is then placed in a reactor (not shown) with an electrophoretic solution 310, along with conductive particles 205 carrying positive charges. As shown in FIG. 4e, a negative electric field is applied on the Gold electrode 303 and the Gold electrode bumps 304. The conductive particles 205 carrying positive charges migrate to the surface of the Gold electrode bumps 304 under the electric field. The conductive particles 205 carrying positive charges are loosely coupled with the surfaces of the Gold electrode bumps 304 and, therefore, the electric field has to be maintained, as shown in FIG. 4f. In the mean time, a small amount of Au-ion solution is added into the electrophoretic solution 310 to form an electroplating solution 411. Then, through an electroplating process with direct or pulse current, the conductive particles 205 carrying positive charges and the Gold electrode bumps 304 jointly form a layer of Gold film 412, as shown in FIG. 4g. With the Gold film 412, the conductive particles 205 carrying positive charges are fixed to the Gold electrode bumps 304 and will not drift away during subsequent cleaning or bonding process. After the foregoing electrophoretic positioning and fixing procedure, the electric field is removed and the chip 301 is taken out of the reactor. The residual photoresist 306 and the Gold electrode 303 besides those on the Gold electrode bumps 304 are removed, as shown in FIG. 4h. At the last step, a non-conductive adhesive 307 is used to bond the chip 301 and the substrate 308 together, as shown in FIG. 4i. The bumps 309 on the second chip 308, conductive particles 205 carrying positive charges, Gold film 412, and Gold electrode bumps 304 jointly form the electric connection between the chip 301 and the substrate 308.

In the aforementioned Au-ion solution, the Au-ion can be replaced by other metallic ions such as Cu-ion, Ni-ion, or any combination of the above.

Figure 5A:
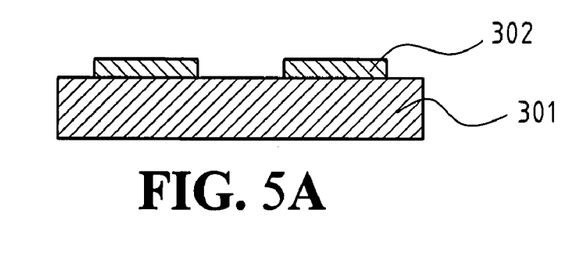
FIGS. 5a to 5i are schematic diagrams showing the steps of dispersing neutral conductive particles respectively.
Figure 5B:
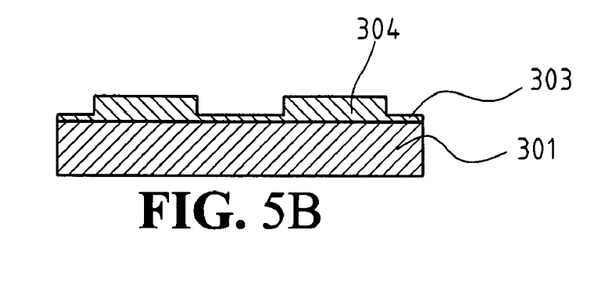
Figure 5C:
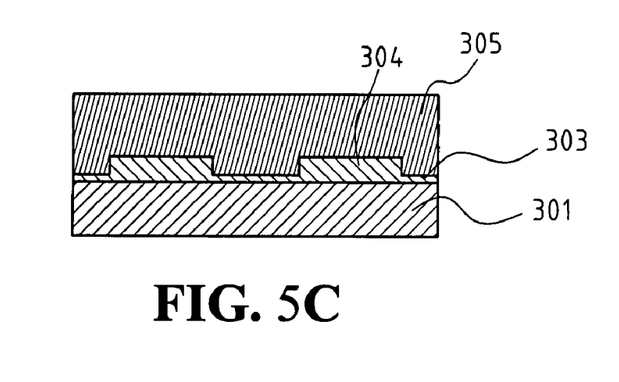
Figure 5D:
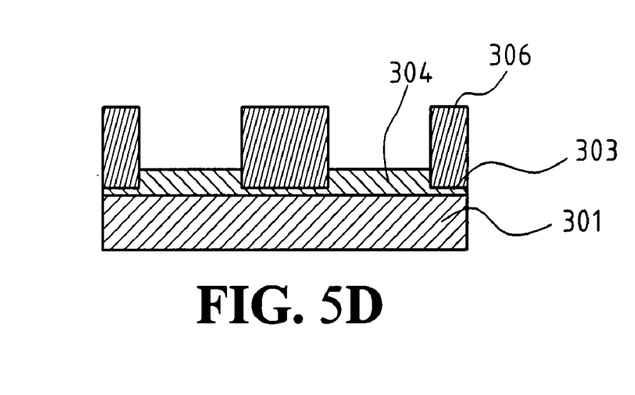
Figure 5E:
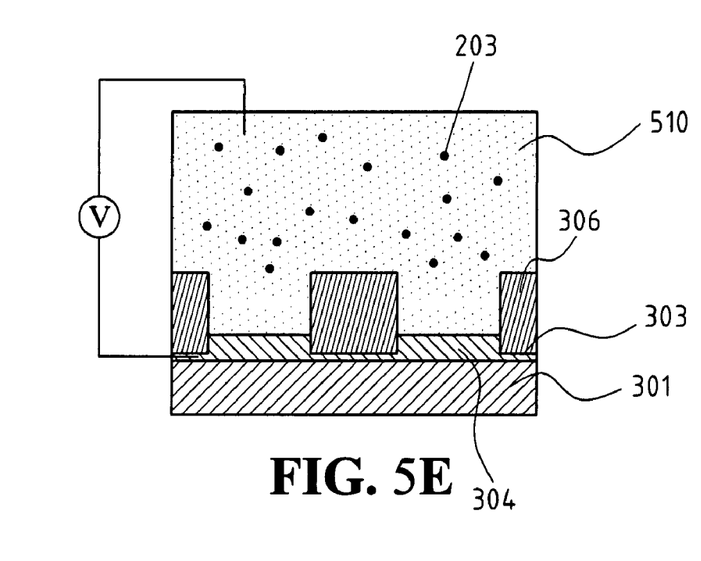
Figure 5F:
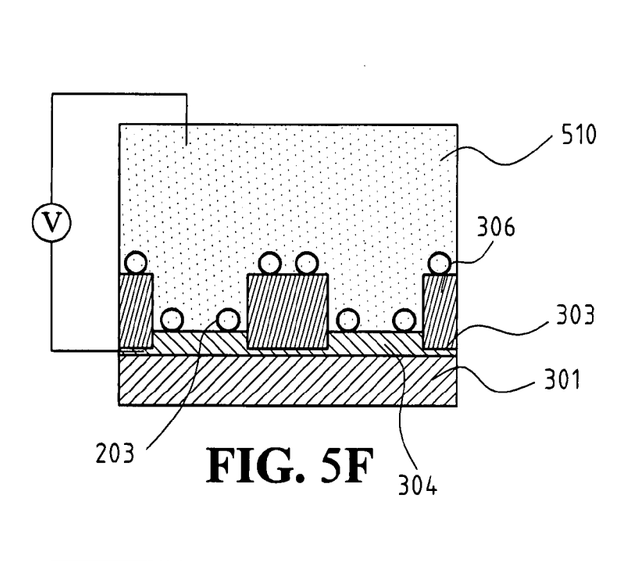
Figure 5G:
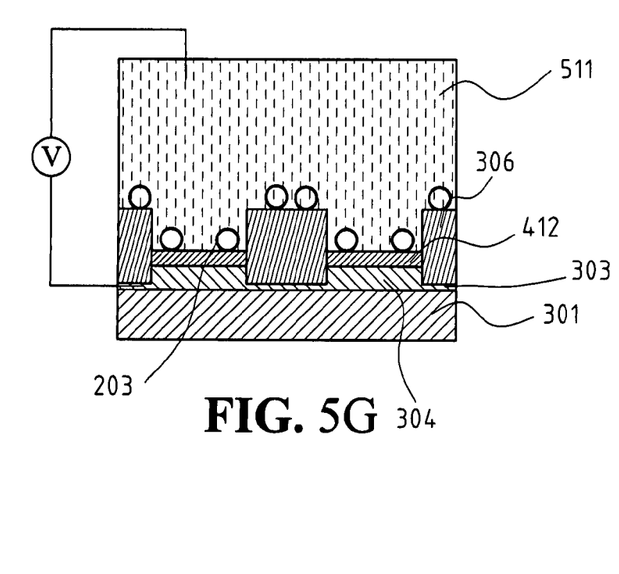
Figure 5H:
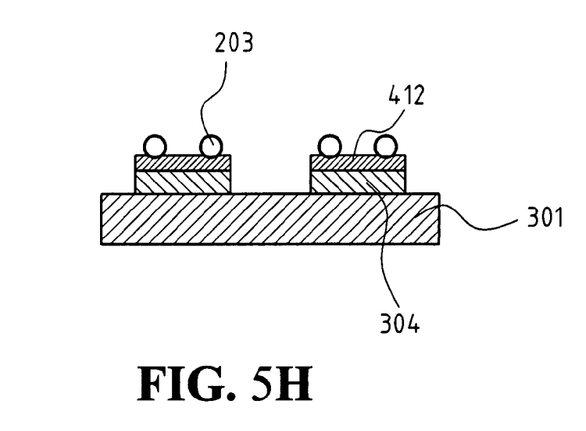
Figure 5I:
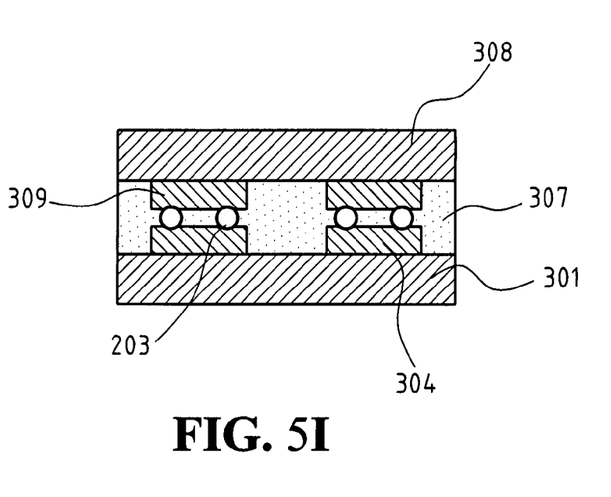

FIGS. 5a to 5i are schematic diagrams showing the steps of dispersing neutral conductive particles respectively. As shown in FIG. 5a, the chip 301 has a plurality of bumps 302 on a surface of the chip 301 for joining with a substrate (not shown in FIG. 5a). The chip 301 is then sputtered with a layer of Gold electrode 303. The Gold electrode 303 and the bumps 302 jointly form the Gold electrode bumps 304, as shown in FIG. 5b. A layer of photoresist 305 is coated on top of the Gold electrode 303 and the Gold electrode bumps 304, as shown in FIG. 5c. A lithography process is then conducted to remove the photoresist 305 on top of the Gold electrode bumps 304, and residual photoresist 306 is left on the Gold electrode 303, as shown in FIG. 5d. The etched chip 301 is then placed in a reactor (not shown) with an aqueous solution 510, along with conductive particles 203 not carrying any charge, as shown in FIG. 5e. The chip 301 is left in the solution 510 for a period of time so that the conductive particles 203 will sink naturally to the surfaces of the Gold electrode bumps 304 and residual photoresist 306 as shown in FIG. 5f. A small amount of Au-ion solution is added into the aqueous solution 510 to form an electroplating solution 511. Then, through an electroplating process with direct or pulse current, the conductive particles 203 not carrying any charge and the Gold electrode bumps 304 jointly form a layer of Gold film 412, as shown in FIG. 5g. With the Gold film 412, the conductive particles 203 not carrying any charge are fixed to the Gold electrode bumps 304 and will not drift away during subsequent cleaning or joining operations. After the foregoing electrophoretic positioning and fixing procedure, the electric field is removed and the chip 301 is taken out of the reactor. The residual photoresist 306 and the Gold electrode 303 besides those on the Gold electrode bumps 304 are removed, as shown in FIG. 5h. In the last step, a non-conductive adhesive 307 is used to join the chip 301 and the substrate 308 together, as shown in FIG. 5i. The bumps 309 on the substrate 308, conductive particles 203 not carrying any charge, Gold film 412, and Gold electrode bumps 304 jointly form the electric connection between the chip 301 and the substrate 308.

In the aforementioned Au-ion solution, the Au-ion can be replaced by other metallic ions such as Cu-ion, Ni-ion, or any combination of the above.

Figure 6:
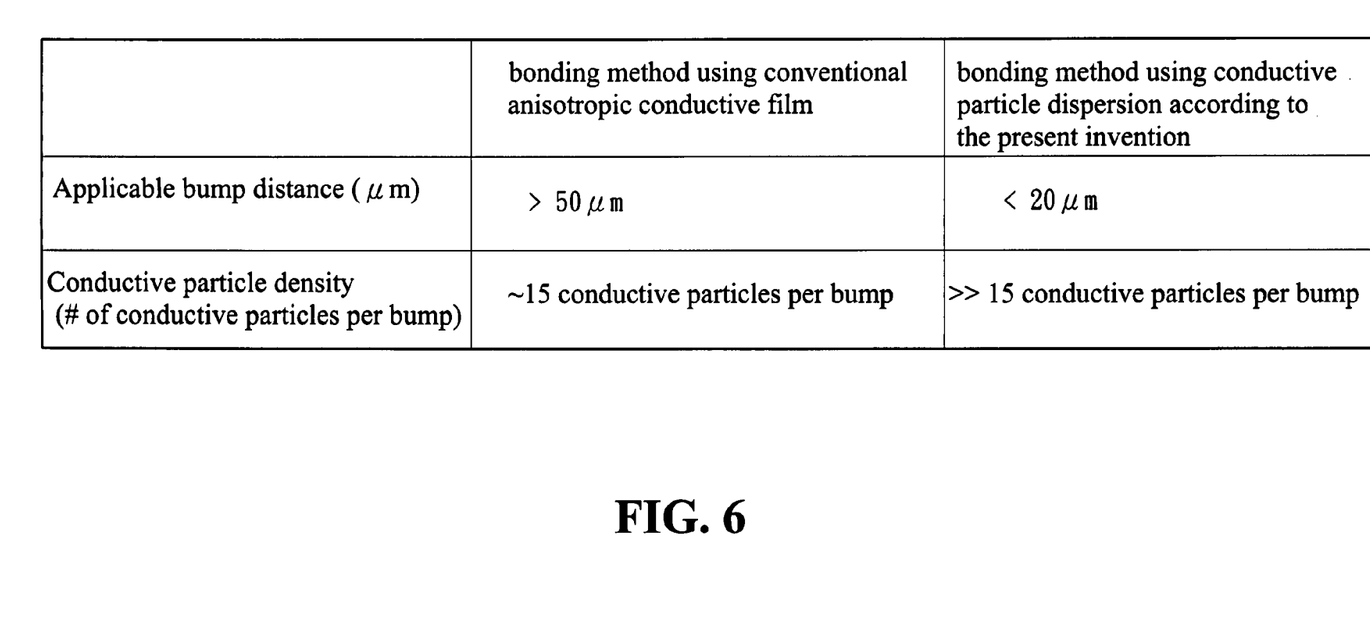
FIG. 6 is a comparison chart showing the differences between bonding methods using the conventional anisotropic conductive films and the present invention.

FIG. 6 is a comparison chart showing the differences between joining methods using the conventional anisotropic conductive films and the present invention. As shown in FIG. 6, when using anisotropic conductive films to bond a chip according to prior arts, the distance between the bumps on the chip must be greater than 50 μm. On the other hand, the electrophoretic fixing technique proposed by the present invention can be applied to bond a chip, and the distance between the bumps on the chip can be less than 20 μm. The conductive particle density is about 15/bump when using anisotropic conductive films to bond a chip according to prior arts, while the conductive particle density is much greater than 15 per bump when using the electrophoretic fixing technique proposed by the present invention.

Figure 7:
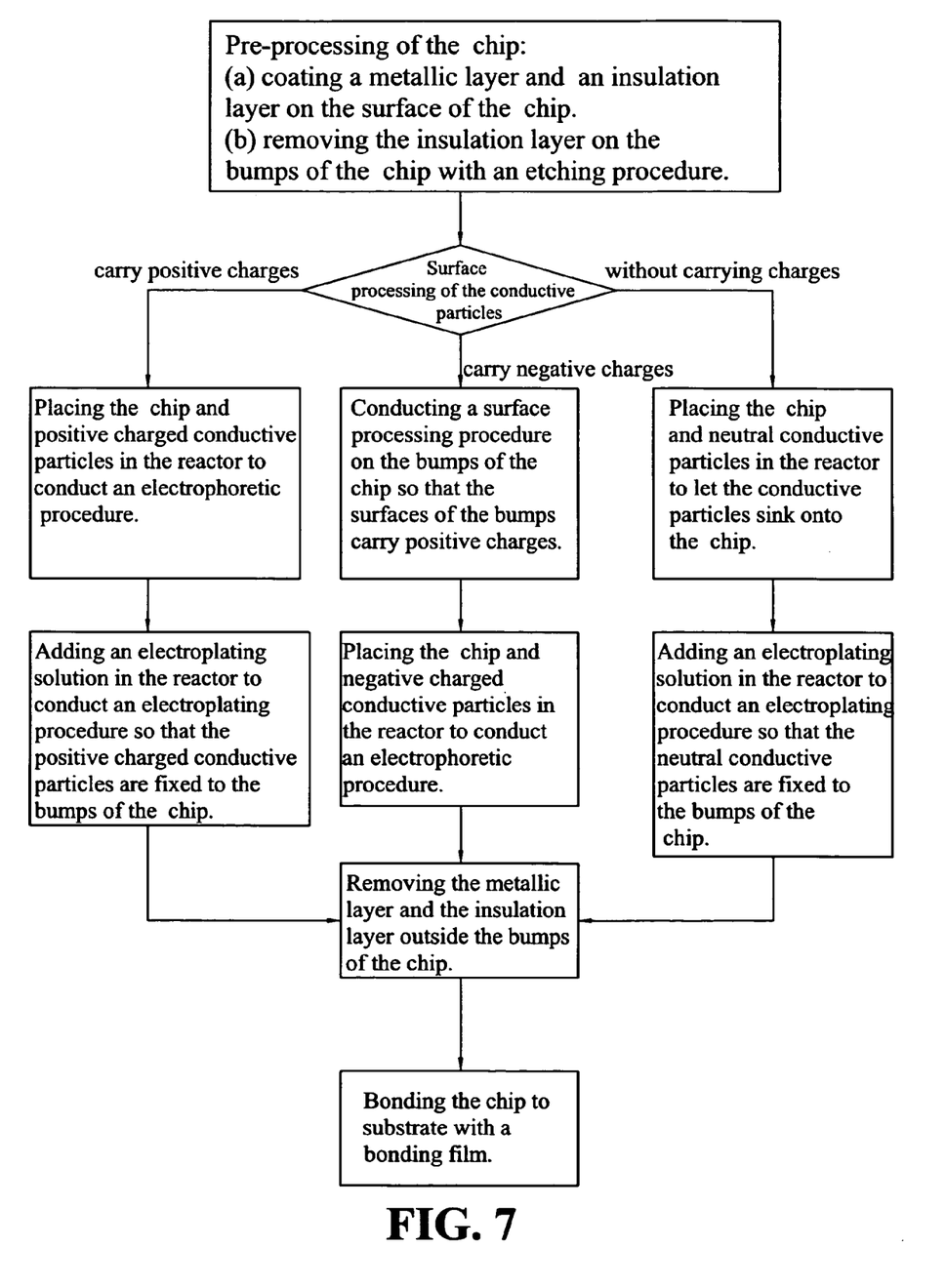
FIG. 7 is a flowchart summarizing the embodiments of the method for dispersing conductive particles according to the present invention.

FIG. 7 is a flowchart summarizing the foregoing embodiments of the method for dispersing conductive particles according to the present invention.

Although the present invention has been described with reference to the preferred embodiments, it will be understood that the invention is not limited to the details described thereof. Various substitutions and modifications have been suggested in the foregoing description, and others will occur to those or ordinary skill in the art. Therefore, all such substitutions and modifications are intended to be embraced within the scope of the invention as defined in the appended claims.

What is claimed is:

1. A method for dispersing conductive particles comprising the steps of:
   (a) conducting a pre-processing procedure on a chip having at least a bump to form a continuous electrode to connect each said bump with a metallic layer and then placing said chip into a reactor with a solution;
   (b) preparing a plurality of conductive particles and then placing said conductive particles into said reactor;
   (c) conducting a fixing procedure on said conductive particles; and
   (d) bonding said chip with a substrate.

2. The method for dispersing conductive particles according to claim 1, wherein said preprocessing procedure in step (a) further comprises the steps of:
   (a1) coating a metallic layer and then an insulation layer on a surface of said chip; and
   (a2) removing said insulation layer on said bump with an etching procedure.

3. The method for dispersing conductive particles according to claim 2, wherein said metallic layer is a Gold electrode.

4. The method for dispersing conductive particles according to claim 2, wherein said insulation layer is a photoresist.

5. The method for dispersing conductive particles according to claim 1, wherein said bump is a metallic bump.

6. The method for dispersing conductive particles according to claim 1, wherein said bump is a compliant bump made of a macromolecular polymer wrapped within a metallic layer.

7. The method for dispersing conductive particles according to claim 1, wherein said solution in said reactor is an aqueous solution.

8. The method for dispersing conductive particles according to claim 7, wherein said aqueous solution is selected from the group consisting of neutral water solution, acid aqueous solution, and alkaline aqueous solution.

9. The method for dispersing conductive particles according to claim 1, wherein said conductive particles have an interior made of macromolecular polymer resin.

10. The method for dispersing conductive particles according to claim 1, wherein said conductive particles have an exterior made of a metal layer.

11. The method for dispersing conductive particles according to claim 10, wherein said metal layer of said exterior of said conductive particles is selected from the group consisting of Gold and Nickel.

12. The method for dispersing conductive particles according to claim 1, wherein step (b) includes a surface processing procedure which utilizes a thiol compound carrying a positive charge to cause said conductive particles to carry positive charges.

13. The method for dispersing conductive particles according to claim 12, wherein said thiol compound carrying a positive charge has a dimethylamino ($-(CH_3)_2NH$) functional group on an end of said thiol compound's molecular structure.

14. The method for dispersing conductive particles according to claim 1, wherein step (b) includes a surface processing procedure which utilizes a thiol compound carrying a negative charge to cause said conductive particles to carry negative charges.

15. The method for dispersing conductive particles according to claim 14, wherein said thiol compound carrying a negative charge has a sulfite ($-SO_3$) functional group on an end of said thiol compound's molecular structure.

16. The method for dispersing conductive particles according to claim 1, wherein said bonding of said chip and said substrate is by a non-conductive adhesive.

17. The method for dispersing conductive particles according to claim 1, wherein said fixing procedure in step (c) further comprises the steps of:
   (c1) conducting a migrating and positioning procedure to migrate and position said conductive particles to said bump of said chip; and
   (c2) conducting a fixing procedure to fix said conductive particles to said bump.

18. The method for dispersing conductive particles according to claim 17, wherein said migrating and positioning procedure is an electrophoretic procedure.

19. The method for dispersing conductive particles according to claim 18, wherein said electrophoretic procedure further comprises the steps of:
   applying an electric field having electric polarity opposite to that of said conductive particles on said chip; and
   removing said electric field after an electrophoresis process of said conductive particles is finished.

20. The method for dispersing conductive particles according to claim 17, wherein said migrating and positioning procedure is to let said conductive particles sink naturally.

21. The method for dispersing conductive particles according to claim 17, wherein said conductive particles are charged and said fixing procedure further comprises the steps of:
   conducting a surface processing procedure on said metallic layer of said chip using a charged thiol compound so that said metallic layer's surface carries a charge whose electric polarity is opposite to that of said conductive particles; and
   allowing said charged conductive particles attracted to said charged metallic layer and thereby fixed to said bump.

22. The method for dispersing conductive particles according to claim 17, wherein said fixing procedure is an electroplating procedure.

23. The method for dispersing conductive particles according to claim 22, wherein said electroplating procedure further comprises the steps of:
   adding an electroplating solution into said reactor after said conductive particles are migrated and positioned to said bump of said chip; and
   using a pulse or direct current to electroplate a metallic film between said conductive particles and said metallic layer so that said conductive particles are fixed to said bump.

24. The method for dispersing conductive particles according to claim 23, wherein said electroplating solution comprises metallic ions.

25. The method for dispersing conductive particles according to claim 23, wherein said electroplating solution comprises at least a type of metallic ions selected from the group consisting of Au-ion, Cu-ion, and Ni-ion.

26. The method for dispersing conductive particles according to claim 23, wherein said metallic film comprises at least a metal selected from the group consisting of Au, Cu, and Ni.

* * * * *